United States Patent
Jung et al.

(10) Patent No.: US 10,734,951 B2
(45) Date of Patent: Aug. 4, 2020

(54) RECEIVER CIRCUIT

(71) Applicants: SK hynix Inc., Icheon (KR); NORTHEASTERN UNIVERSITY, Boston, MA (US)

(72) Inventors: Hae Kang Jung, Gwangmyeong (KR); Yong Suk Choi, Seoul (KR); Yong Bin Kim, Franklin, MA (US); Gyunam Jeon, Yongin (KR); Dae-Han Kwon, Icheon (KR); Joo Hwan Cho, Icheon (KR)

(73) Assignees: SK hynix Inc., Icheon (KR); NORTHEASTERN UNIVERSITY, Boston, MA (US)

(*) Notice: Subject to any disclaimer, the term of this patent is extended or adjusted under 35 U.S.C. 154(b) by 0 days.

(21) Appl. No.: 15/945,642

(22) Filed: Apr. 4, 2018

(65) Prior Publication Data

US 2019/0312550 A1 Oct. 10, 2019

(51) Int. Cl.
| | |
|---|---|
| *H03F 3/45* | (2006.01) |
| *H03F 1/02* | (2006.01) |
| *H03F 3/19* | (2006.01) |
| *H03G 3/30* | (2006.01) |
| *H04B 1/16* | (2006.01) |
| *H03K 3/356* | (2006.01) |

(52) U.S. Cl.
CPC ............ *H03F 1/0205* (2013.01); *H03F 3/19* (2013.01); *H03G 3/3036* (2013.01); *H03K 3/356* (2013.01); *H04B 1/16* (2013.01); *H03F 2200/129* (2013.01); *H03F 2200/87* (2013.01)

(58) Field of Classification Search
CPC .... H03F 1/0205; H03F 3/19; H03F 2200/129; H03F 2200/87; H03K 3/356; H04B 1/16; H03G 3/3036

USPC ............ 330/252–261, 278; 341/139; 327/51
See application file for complete search history.

(56) References Cited

U.S. PATENT DOCUMENTS

| | | | |
|---|---|---|---|
| 6,396,329 B1* | 5/2002 | Zerbe | G11C 7/02 327/319 |
| 6,873,143 B2 | 3/2005 | Moon et al. | |
| 7,102,342 B2 | 9/2006 | Kim | |
| 7,271,623 B2* | 9/2007 | Palmer | G11C 7/1078 327/52 |

OTHER PUBLICATIONS

Borivoje Nikolic et al., "Improved Sense-Amplifier-Based Flip-Flop: Design and Measurements", IEEE Journal of Solid-State Circuits, Jun. 2000, pp. 876-884, vol. 35, No. 6, IEEE.
Yongsuk Choi et al., "Transceiver Design for LVSTL Signal Interface with a Low Power On-Chip Self Calibration Scheme", pp. 1-9, Submitted to IEEE for publication on Jul. 25, 2017.

* cited by examiner

*Primary Examiner* — Khanh V Nguyen
*Assistant Examiner* — Khiem D Nguyen (57) ABSTRACT

A receiver circuit receives a signal from a semiconductor device. The receiver circuit includes an input buffer including a first plurality of transistors, the input buffer being configured to detect a fabrication condition of the receiver circuit, generate a control signal according to the detected fabrication condition, and control a gain of an input signal by adjusting a number of operating transistors among the first plurality of transistors in response to the control signal; and a latch circuit configured to latch an output signal of the input buffer, and adjust threshold voltages of a second plurality of transistors in response to a test signal.

20 Claims, 5 Drawing Sheets

RECEIVER CIRCUIT

BACKGROUND

Embodiments of the present disclosure may generally relate to a receiver circuit, and more particularly to a technology for a receiver capable of receiving a signal in a semiconductor device.

Electronic products such as a personal computer (PC), a tablet, a laptop, a smartphone, etc. may include various electronic elements. Two different electronic elements contained in each electronic product may communicate with each other at a high speed so as to process more data within a short time. Among these electronic elements, semiconductor devices may each include a transmitter circuit and a receiver circuit, such that the semiconductor devices may communicate with each other.

The semiconductor devices may be coupled to each other through a signal transmission line such as a bus, so that the semiconductor devices may communicate with each other. A signal transmitted along the transmission line in each semiconductor device may be reflected from the end of the transmission line. The reflected signal may cause noise, such that an original signal may be affected by the noise, resulting in reduction of a signal quality. During signal transmission along the transmission line in the semiconductor device, when degradation of the signal occurs, the operation speed of the semiconductor device may be reduced. Accordingly, the receiver circuit may recover the attenuated signal to the original signal.

With rapid development of higher-performance semiconductor devices, semiconductor devices capable of operating at a relatively high speed while simultaneously reducing power consumption have been developed. However, the level or amplitude of a signal transmitted through a bus is gradually reducing. Therefore, an improved receiver circuit that recovers the transmitted signal and reduces power consumption is desirable.

BRIEF SUMMARY

Various embodiments of the present disclosure are directed to providing a receiver circuit that substantially obviates one or more issues due to limitations and disadvantages of the related art.

An embodiment of the present disclosure relates to a technology for reducing power consumption by adaptively and actively controlling a gain of a receiver circuit in response to a fabrication change of a semiconductor device.

In accordance with an embodiment of the present disclosure, a receiver circuit includes: an input buffer including a first plurality of transistors, the input buffer being configured to detect a fabrication condition of the receiver circuit, generate a control signal according to the detected fabrication condition, and control a gain of an input signal by adjusting a number of operating transistors among the first plurality of transistors in response to the control signal; and a latch circuit configured to latch an output signal of the input buffer and adjust threshold voltages of a second plurality of transistors in response to a test signal.

It is to be understood that both the foregoing general description and the following detailed description of the present disclosure are exemplary and explanatory and are intended to provide further explanation of the invention as claimed.

BRIEF DESCRIPTION OF THE DRAWINGS

The above and other features and beneficial aspects of embodiments of the present disclosure will become apparent by reference to the following detailed description when considered in conjunction with the accompanying drawings wherein.

DESCRIPTION OF EMBODIMENTS

Reference will now be made in detail to embodiments of the present disclosure, examples of which are illustrated in the accompanying drawings. Wherever possible, the same reference numbers are used throughout the drawings to refer to the same or like portions.

In association with the embodiments of the present disclosure, specific structural and functional descriptions are disclosed only for illustrative purposes, the embodiments of the present disclosure can be implemented in various ways without departing from the scope or spirit of the present disclosure.

In description of the present disclosure, the terms "first" and "second" may be used to describe various components, but the components are not limited by the terms. The terms may be used to distinguish one component from another component. For example, a first component may be called a second component and a second component may be called a first component without departing from the scope of the present disclosure.

The terms used in the present application are merely used to describe specific embodiments and are not intended to limit the present disclosure. A singular expression may include a plural expression unless otherwise stated in the context.

Unless otherwise defined, all terms used herein, including technical or scientific terms, have the same meanings as understood by those skilled in the art. Terms defined in a generally used dictionary may be analyzed to have the same meaning as the context of the relevant art and may not be analyzed to have ideal meaning or excessively formal meaning unless clearly defined in the present application. The terminology used in the present disclosure is for the purpose of describing particular embodiments only and is not intended to limit the disclosure.

Figure 1:
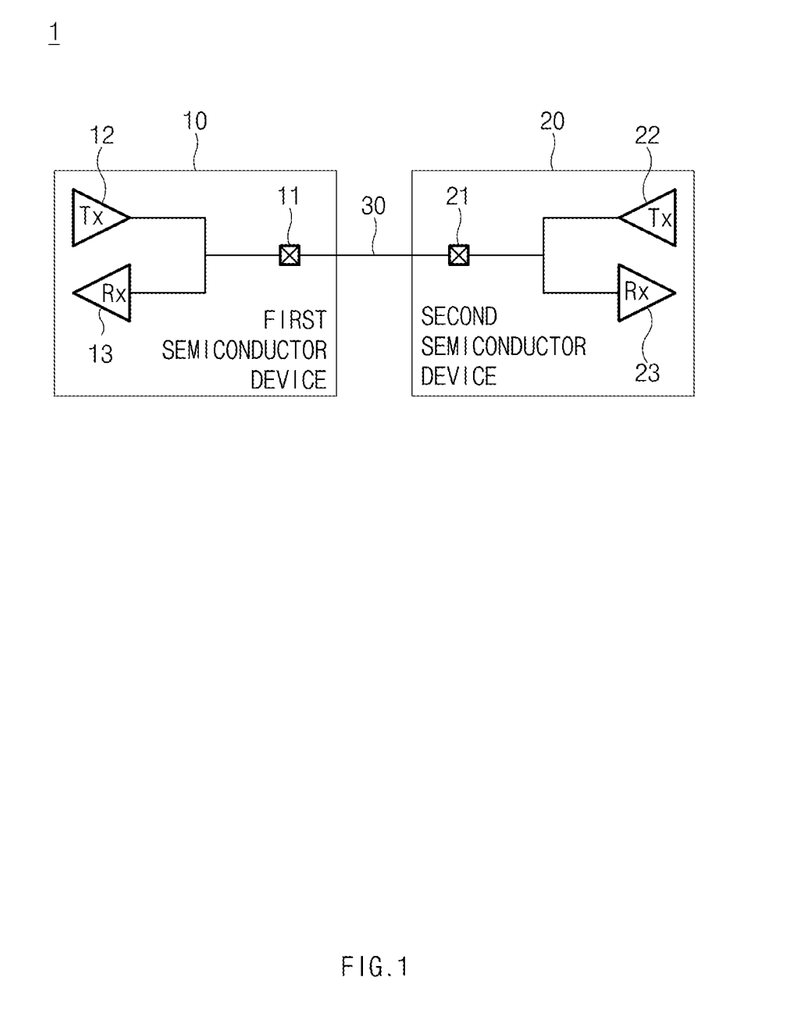
FIG. 1 is a block diagram illustrating a semiconductor device according to an embodiment of the present disclosure.

FIG. 1 is a block diagram illustrating a semiconductor device 1 according to an embodiment of the present disclosure.

Referring to FIG. 1, the semiconductor device 1 according to the embodiment of the present disclosure may include a first semiconductor device 10 and a second semiconductor device 20.

In this case, the first semiconductor device 10 and the second semiconductor device 20 may be electronic elements capable of communicating with each other. In an embodiment, the first semiconductor device 10 may be a master device, and the second semiconductor device 20 may be a slave device controlled by the first semiconductor device 10.

For example, the first semiconductor device 10 may be a host device such as a processor. The processor may include a Central Processing Unit (CPU), a Graphic Processing Unit (GPU), a multimedia processor (MMP), a digital signal processor (DSP), etc. In addition, a combination of processor chips (such as application processors APs) having various functions may be implemented as a System on Chip (SOC).

The second semiconductor device 20 may be a memory, and the memory may include one or more of a volatile memory and a non-volatile memory. The volatile memory may include one or more of a static random-access memory (RAM) (SRAM), a dynamic RAM (DRAM), and a synchronous DRAM (SDRAM). The non-volatile memory may include one or more of a read only memory (ROM), a programmable read-only memory (PROM), an erasable erase and programmable ROM (EEPROM), an electrically erasable and programmable ROM (EPROM), a flash memory, a phase change RAM (PRAM), a magnetic RAM (MRAM), a resistive RAM (RRAM), a ferroelectric RAM (FRAM), etc.

The first semiconductor device 10 and the second semiconductor device 20 may be coupled to each other through a signal transmission line 30. The first semiconductor device 10 may include a pad 11, and the pad 11 may be coupled to a first end of the signal transmission line 30. The second semiconductor device 20 may include a pad 21, and the pad 21 may be coupled to a second end of the signal transmission line 30. In this case, the signal transmission line 30 may be a channel, a link, or a bus.

The first semiconductor device 10 may include a transmitter circuit (Tx) 12 and a receiver circuit (Rx) 13. The transmitter circuit 12 may generate an output signal according to an internal signal of the first semiconductor device 10, and may transmit the output signal to the second semiconductor device 20 through the signal transmission line 30. The receiver circuit 13 may receive a signal from the second semiconductor device 20 through the signal transmission line 30, and may thus generate an internal signal. The signal received through the transmission line 30 may be a differential signal.

Likewise, the second semiconductor device 20 may include a transmitter circuit (Tx) 22 and a receiver circuit (Rx) 23. The transmitter circuit 22 may generate an output signal according to an internal signal of the second semiconductor device 20, and may transmit the output signal to the first semiconductor device 10 through the signal transmission line 30. The receiver circuit 23 may receive a signal from the first semiconductor device 10 through the signal transmission line 30, and may thus generate an internal signal. The signal received through the transmission line 30 may be a differential signal.

Figure 2:
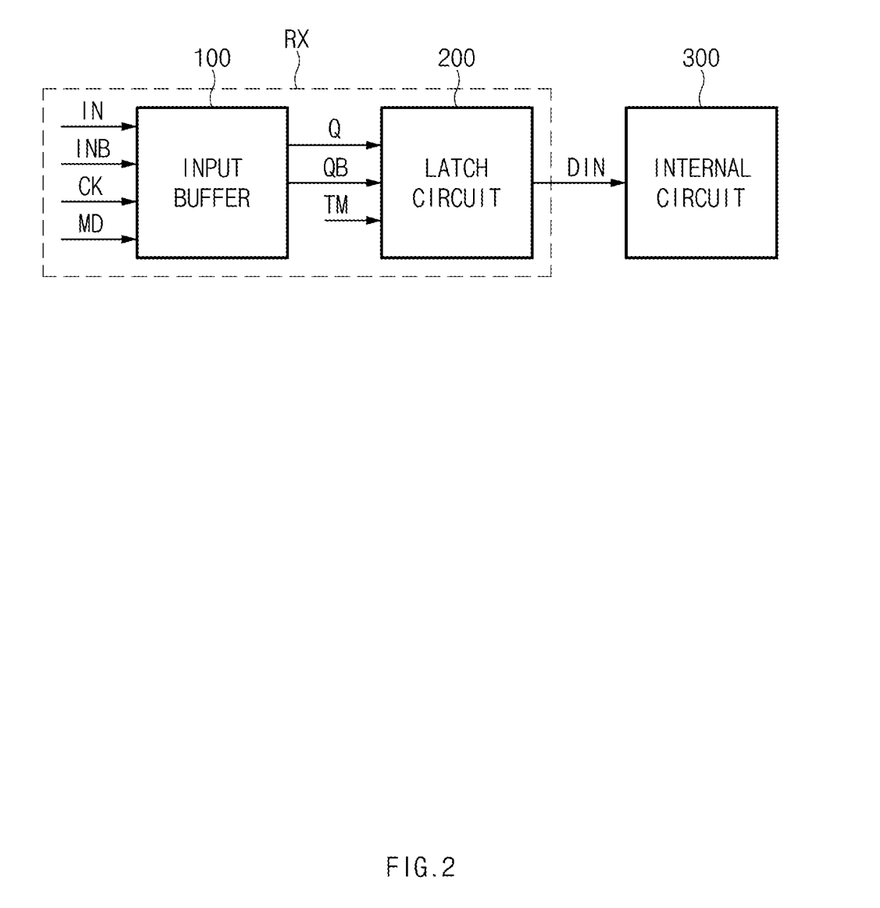
FIG. 2 is a block diagram illustrating a receiver circuit according to an embodiment of the present disclosure.

FIG. 2 is a block diagram illustrating a receiver circuit RX according to an embodiment of the present disclosure. Referring to FIG. 2, the receiver circuit Rx may correspond to the receiver circuit 13 or 23 illustrated in FIG. 1.

In this case, the receiver circuit Rx may include an input buffer 100 and a latch circuit 200. The input buffer 100 may buffer first and second input signals IN and INB in response to a clock signal CLK and a mode signal MD, and may output first and second latch signals Q and QB to the latch circuit 200. Here, the second input signal INB is an inverted version of the first input signal IN.

The latch circuit 200 may generate internal data signal DIN by latching the first and second latch signals Q and QB. In this case, the second latch signal QB may be an inverted version of the first latch signal Q. The latch circuit 200 may adjust a threshold voltage value of each of one or more transistors of the latch circuit 200 in response to a test signal TM. The internal data signal DIN may indicate data for controlling internal operations of the semiconductor devices 10 and 20.

Figure 3:
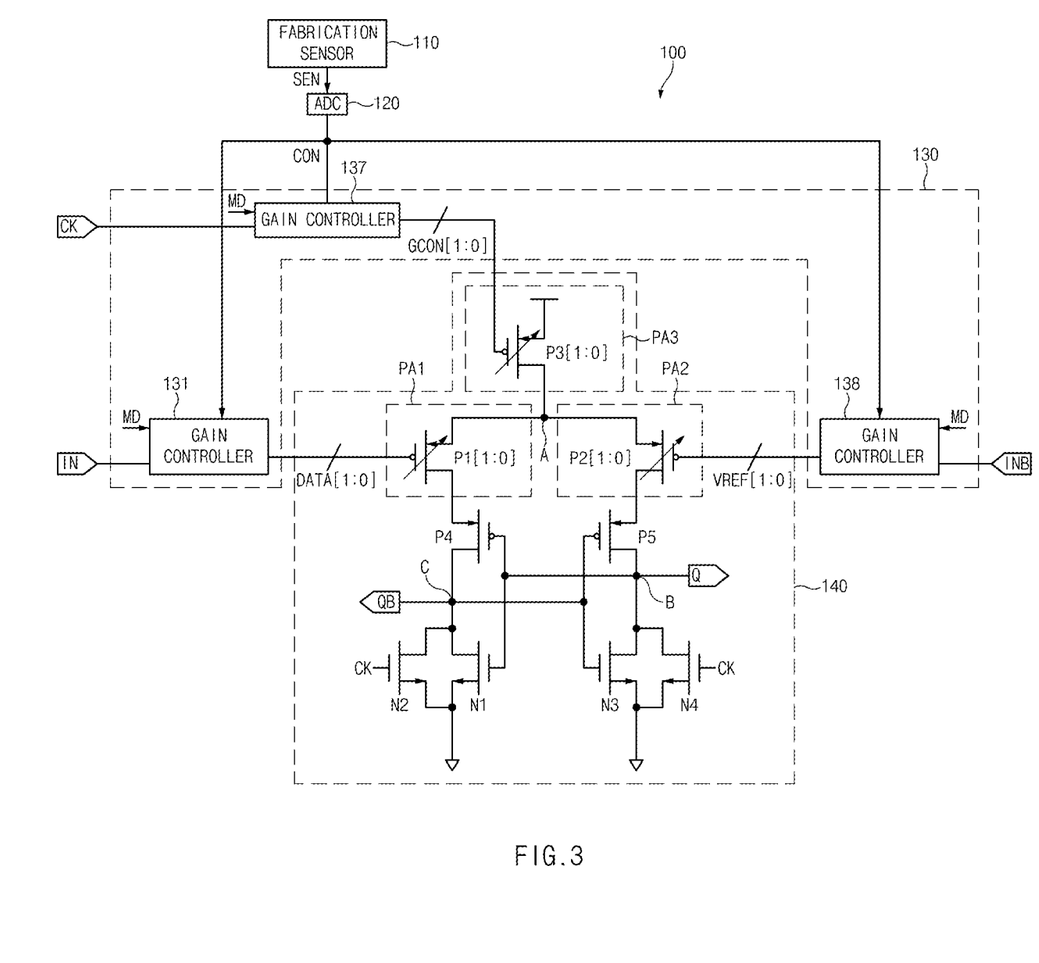
FIG. 3 illustrates a circuit diagram of an input buffer suitable for use as an input buffer in FIG. 2 according to an embodiment.

FIG. 3 is a circuit diagram illustrating the input buffer 100 of FIG. 2 according to an embodiment.

Referring to FIG. 3, the input buffer 100 may include a fabrication sensor 110, an analog-to-digital converter (ADC) 120, a controller 130, and an amplification circuit 140.

In this case, the fabrication sensor 110 may detect a fabrication condition of a semiconductor device, and may output a sensing signal SEN having an analog value. An element included in the semiconductor device may have various characteristics. For example, a plurality of N-type metal-oxide-semiconductor (NMOS) transistors may have different characteristic values (e.g., threshold voltages) according to various fabrication conditions (for example, Slow, Typical, and Fast). A gain of the amplification circuit 140 is adjusted to reflect the different characteristic values of the elements in the semiconductor device using the sensing signal SEN indicative of one of the fabrication conditions by detecting a fabrication change of the semiconductor device.

In the embodiment shown in FIG. 3, in order to reduce power consumption, the fabrication sensor 110 may stop operating after detecting the fabrication change and generating the sensing signal SEN once. The fabrication conditions of the receiver circuit RX of FIG. 2 may be classified into three fabrication conditions, for example, Slow, Typical, and Fast. The fabrication sensor 110 may output an analog signal indicating any one of three fabrication conditions. One fabrication sensor 110 may be formed in a die, and the sensing signal SEN generated by the fabrication sensor 110 may be shared and used by several circuits throughout the entire die.

The ADC 120 may convert the sensing signal SEN that is the analog signal generated from the fabrication sensor 110 into a control signal CON that is a digital signal.

The controller 130 may generate one or more signals for controlling the gain of the amplification circuit 140 using a control signal CON, a mode signal MD, an input clock signal CK, and first and second input signals IN and INB. The controller 130 may output signals Data[1:0], GCON[1:0], and Vref[1:0], each of which has a value changing with a value of the control signal CON and is applied to gate terminals of a corresponding transistor array of the amplification circuit 140, thereby adjusting a value (e.g., a voltage level) of a signal (e.g., the internal data signal DIN in FIG. 2) supplied to the internal circuit 300 in FIG. 2. The controller 130 may include first, second, and third gain controllers 131, 137, and 138.

The first gain controller 131 may output data signal (or a first gain controlled signal) DATA[1:0] for controlling the gain value of the amplification circuit 140 in response to the control signal CON, the mode signal MD, and the first input signal IN. The second gain controller 137 may output a gate control signal (or a second gain controlled signal) GCON[1:0] for controlling the gain value of the amplification circuit 140 in response to the control signal CON, the mode signal MD, and the clock signal CK. In addition, the third gain controller 138 may output a reference signal (or a third gain controlled signal) VREF[1:0] for controlling the gain value of the amplification circuit 140 in response to the control signal CON, the mode signal MD, and the second input signal INB.

The amplification circuit 140 may amplify the first and second input signals IN and INB, and may output first and second latch signals Q and QB, each of which is amplified with a gain adjusted in response to the output signals Data[1:0], GCON[1:0], and Vref[1:0] of the controller 130. The amplification circuit 140 may include a plurality of transistor arrays PA1, PA2, and PA3, each of the plurality of transistor arrays including a plurality of transistors. Each of the plurality of transistors in each of the transistor arrays PA1, PA2, and PA3 may be turned on or off in response to a corresponding one of the output signals Data[1:0], GCON[1:0], and VREF[1:0], respectively, of the controller 130, thereby controlling a voltage level of an output node B or C. The amplification circuit 140 may turn on all or some of the transistors included in the transistor arrays PA1, PA2, and PA3 in response to the sensing signal SEN of the fabrication sensor 110.

The amplification circuit 140 may include first, second, and third transistor arrays PA1, PA2, PA3, PMOS transistors P4 and P5, and NMOS transistors N1, N2, N3, and N4. The first transistor array PA1 may include a plurality of PMOS transistors P1[1:0]. The second transistor array PA2 may include a plurality of PMOS transistors P2[1:0]. The third transistor array PA3 may include a plurality of PMOS transistors P3[1:0].

In this case, the first transistor array PA1, a fourth PMOS transistor P4, and a first NMOS transistor N1 may be coupled in series between a node A and a ground. The first transistor array PA1 may receive the data signal DATA[1:0] through gate terminals of the plurality of PMOS transistors P1[1:0]. A gate of the PMOS transistor P4 and a gate of the NMOS transistor N1 may be commonly coupled to a node B. The amplification circuit 140 may output the first latch signal Q through the node B.

The second transistor array PA2, the PMOS transistor P5, and the NMOS transistor N3 may be coupled in series between the node A and the ground. The second transistor array P2 may receive the reference signal VREF[1:0] through gate terminals of the plurality of PMOS transistors P2[1:0]. A gate of the PMOS transistor P5 and a gate of the NMOS transistor N3 may be commonly coupled to a node C. The amplification circuit 140 may output the second latch signal QB through the node C. The third transistor array PA3 may be coupled between the node A and a power-supply voltage terminal, such that the third transistor array PA3 may receive the gate control signal GCON[1:0] through gate terminals of the plurality of PMOS transistors P3[1:0].

The PMOS transistors P4 and P5 and the NMOS transistors N1 and N3 may be cross-coupled to one another to implement a latch transistor, thereby latching data of the node B and data of the node C. The NMOS transistor N2 may be coupled in parallel to the NMOS transistor N1, and the NMOS transistor N2 may receive the clock signal CK through a gate terminal thereof. In addition, the NMOS transistor N4 may be coupled in parallel to the NMOS transistor N3, and the NMOS transistor N4 may receive the clock signal CK through a gate terminal thereof. Each of the NMOS transistors N2 and N4 may correspond to a clock control transistor.

For convenience of description and better understanding of embodiments of the present disclosure, a single PMOS transistor overlapping with a diagonal arrow in FIG. 3 indicates a transistor array including a plurality of PMOS transistors. In the embodiment shown in FIG. 3, each of the first, second, and third transistor arrays PA1, PA2, and PA3 includes two PMOS transistors, and each of the PMOS transistors in the array PA1, PA2, or PA3, respectively, is selectively activated in response to a corresponding signal of two-line signals DATA[1:0], VREF[1:0], or GCON[1:0].

The total number of turned on transistors included in the arrays PA1, PA2, and PA3 may be controlled by the controller 130. For example, the PMOS transistors included in each of the transistor arrays PA1, PA2, and PA3 are connected in parallel and have gate terminals respectively receiving a corresponding line of the 2-line signal DATA[1:0], VREF[1:0], or GCON[1:0].

Each of the PMOS transistors P1[1:0], P2[1:0] included in the first and second transistor arrays PA1 and PA2 may function as an input transistor, and first and second numbers of operating PMOS transistors P1[1:0], P2[1:0] in the first and second transistor arrays PA1 and PA2 may be adjusted by the data signal DATA[1:0] and the reference signal VREF[1:0], respectively. Each of the PMOS transistors P3[1:0] included in the third transistor array PA3 may function as a tail transistor, and a third number of operating PMOS transistors P3[1:0] in the third transistor array PA3 may be adjusted by the gate control signal GCON[1:0]. For example, each of the operating PMOS transistors P1[1:0] in the first transistor array PA1 conducts a current having a magnitude controlled by a value of a corresponding signal of the data signal DATA[1:0]. Although the above-described illustrative embodiment includes two input transistors in each of the first and second transistor arrays PA1 and PA2 and two tail transistors in the third transistor array PA3, the number of transistors in each of the arrays PA1, PA2, and PA3 is not limited thereto, and the number of transistors may also be changed as necessary.

The operation speed of the amplification circuit 140 may be proportional to the magnitude of a current and a transconductance value of transistors. The embodiment shown in FIG. 3 controls the magnitude of the current flowing in the amplification circuit 140 in response to the output signals DATA[1:0], GCON[1:0], and VREF[1:0] of the gain controllers 131, 137, and 138, thereby improving performance of the amplification circuit 140. In other words, the embodiment shown in FIG. 3 may control a gain value of the amplification circuit 140 by adjusting the number of operating transistors in the first, second, and third transistor arrays PA1, PA2, and PA3 in response to the output signals DATA[1:0], GCON[1:0], and VREF[1:0] of the gain controllers 131, 137, and 138, thereby controlling the operation speed of the amplification circuit 140.

The embodiment shown in FIG. 3 may operate in one of a high-performance mode and a low-power mode according to a data transfer rate. In an embodiment, the mode signal MD indicates that a receiver circuit (e.g., the receiver circuit RX in FIG. 2) operates in the high-performance mode or the low-power mode. In the high-performance mode, all input transistors (e.g., the PMOS transistors P1[1:0], P2[1:0] included in the first and second transistor arrays PA1 and PA2) and all tail transistors (e.g., the PMOS transistors P3[1:0] included in the third transistor array PA3) may operate. In contrast, in the low-power mode, a total number of operating input transistors (e.g., operating PMOS transistors P1[1:0], P2[1:0] in the first and second transistor arrays PA1 and PA2) and operating tail transistors (e.g., operating PMOS transistors P3[1:0] in the third transistor array PA3) may be adjusted by the data signal DATA[1:0], the reference signal VREF[1:0], and the gate control signal GCON[1:0].

In addition, a delay time of the amplification circuit 140 may be proportional to a threshold voltage of each transistor. The sensing signal SEN of the fabrication sensor 110 may have a value that is proportional to the threshold voltage of each transistor. The threshold voltage of each transistor may be used as a variable for a fabrication change of a semiconductor device (e.g., the first semiconductor device 10 or the second semiconductor device 20 in FIG. 1).

Therefore, the fabrication sensor 110 may detect a fabrication change of the semiconductor device, and may control an output signal DATA[1:0], GCON[1:0], or VREF[1:0] of each of the gain controllers 131, 137, and 138 on the basis of the detected fabrication change. The embodiment shown in FIG. 3 may adjust the gain value of the amplification circuit 140 in response to output signals DATA[1:0], GCON [1:0], and VREF[1:0] of the gain controllers 131, 137, and 138. That is, from among the plurality of PMOS transistors included in the amplification circuit 140, some transistors may selectively operate to adjust the gain value. In addition, the embodiment shown in FIG. 3 may adjust one or more threshold voltages of transistors in the latch circuit 200 for latching the output signals Q and QB of the amplification circuit 140, thereby actively controlling characteristics of the receiver circuit (e.g., the receiver circuit RX in FIG. 2).

Figure 4:
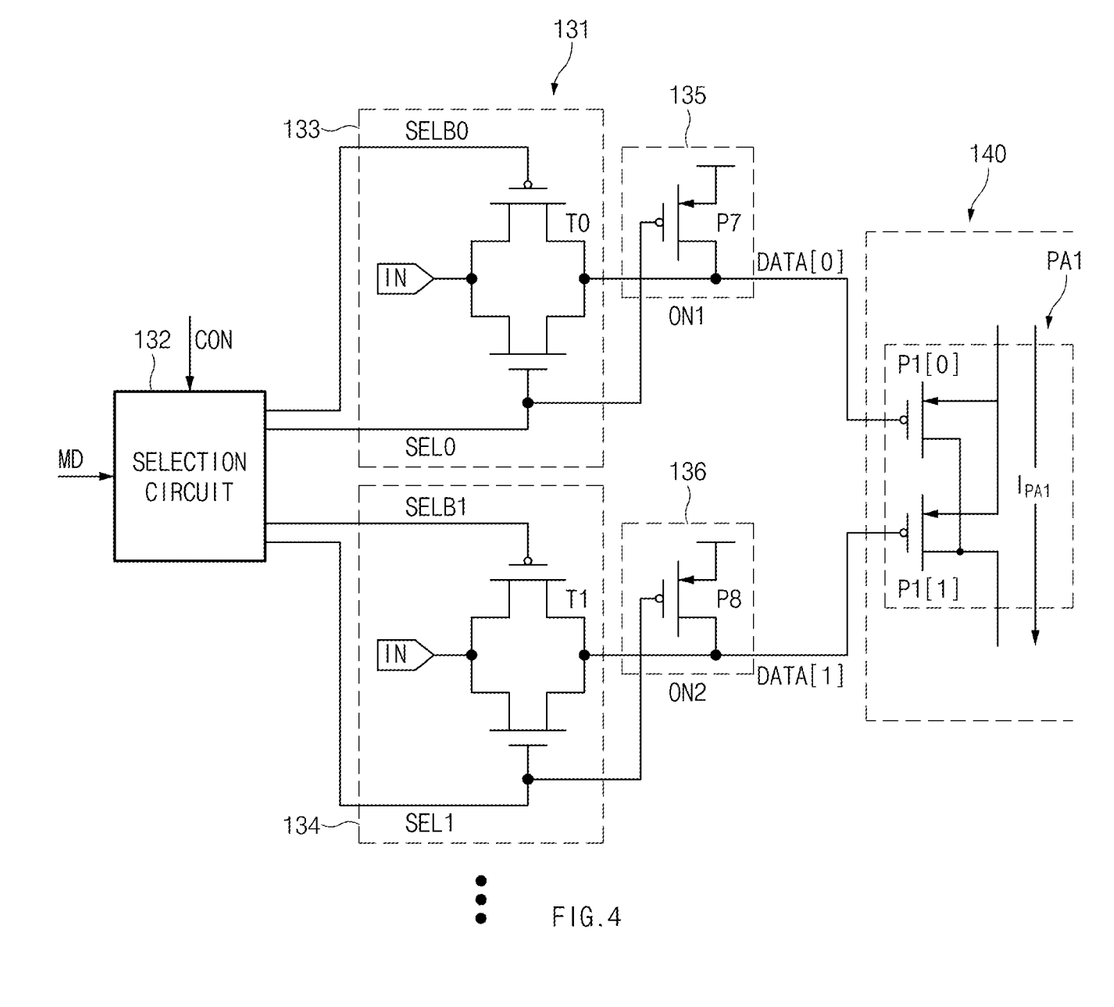
FIG. 4 illustrates a circuit diagram of a gain controller suitable for use as a gain controller in FIG. 3 according to an embodiment.

FIG. 4 is a circuit diagram illustrating a gain controller 131 suitable for use as one of gain controllers 131, 137, and 138 shown in FIG. 3 according to an embodiment. Detailed structures of the respective gain controllers 131, 137, and 138 illustrated in FIG. 3 are identical to each other, and thus the detailed structure of the gain controller 131 will hereinafter be described as an example for convenience of description and better understanding of embodiments of the present disclosure. FIG. 4 also includes details of the first transistor array PA1 of the amplification circuit 140, which includes a first PMOS transistor P1[0] connected in parallel to a second PMOS transistor P1[1].

The gain controller 131 may output first and second data signals DATA[0] and DATA[1] for controlling the gain value of the amplification circuit 140 in response to the control signal CON, the mode signal MD, and the input signal IN. The first and second data signals DATA[0] and DATA[1] indicate first and second signals of the data signal DATA[1:0] in FIG. 3, respectively, and are respectively coupled to gates of the first and second PMOS transistors P1[0] and P1[1] of the first transistor array PA1. The gain controller 131 may activate or deactivate transistors in the first transistor array PA1 in FIG. 3 in response to the control signal CON. As a result, the gain controller 131 may compensate for a change in a voltage level of a data signal applied to an internal circuit.

The gain controller 131 may include a selection circuit 132, first and second output circuits 133 and 134, and first and second precharge circuits 135 and 136.

The selection circuit 132 may output selection signals SEL0, SEL1, SELB0, and SELB1 for selecting the gain value in response to the control signal CON and the mode signal MD. The selection signal SELB0 is an inverted version of the selection signal SEL0, and the selection signal SELB1 is an inverted version of the selection signal SEL1.

In response to the selection signals SEL0 and SELB0, the first output circuit 133 may transmit the input signal IN as the first data signal DATA[0] or may block the input signal IN. The first output circuit 133 may include a transfer gate T0. The transfer gate T0 may transmit the input signal IN as the first data signal DATA[0] in response to the selection signals SEL0 and SELB0 received through gate terminals thereof.

For example, when the selection signal SEL0 has an asserted value (e.g., a high level) and the selection signal SELB0 has a de-asserted value (e.g., a low level), the transfer gate T0 is turned on, so that the transfer gate T0 passes the input signal IN as the first data signal DATA[0]. In contrast, when the selection signal SEL0 has a low level and the selection signal SELB0 has a high level, the transfer gate T0 is turned off, so that the transfer gate T0 blocks the input signal IN, and the PMOS transistor P7 of the first precharge circuit 135 is turned on, driving the first data signal DATA[0] to a high value.

In response to the selection signals SEL1 and SELB1, the second output circuit 134 may transmit the input signal IN as the second data signal DATA[1] or may block the input signal IN. The second output circuit 134 may include a transfer gate T1. The transfer gate T1 may transmit the input signal IN as the second data signal DATA[1] in response to the selection signals SEL1 and SELB1 received through gate terminals thereof.

For example, when the selection signal SEL1 has an asserted value (e.g., a high level) and the selection signal SELB1 has a de-asserted value (e.g., a low level), the transfer gate T1 is turned on, so that the transfer gate T1 transmits the input signal IN as the second data signal DATA[1]. In contrast, when the selection signal SEL1 has a low level and the selection signal SELB1 has a high level, the transfer gate T1 is turned off, so that the transfer gate T1 blocks the input signal IN, and the PMOS transistor P8 of the second precharge circuit 136 is turned on, driving the first data signal DATA[0] to a high value.

The first precharge circuit 135 may include a PMOS transistor P7. When the first output circuit 133 is turned off (that is, when the first output circuit 133 is not passing the value of the input signal IN to the first data signal DATA[0]), the first precharge circuit 135 may precharge the first data signal DATA[0] so as to prevent reduction of a voltage.

The PMOS transistor P7 may be coupled between a power-supply voltage terminal and an output node ON1, and may receive the selection signal SEL0 through a gate terminal thereof. When the selection signal SEL0 is asserted to a high level, the PMOS transistor P7 may be turned off. In contrast, when the selection signal SEL0 is de-asserted to a low level, the PMOS transistor P7 is turned on, so that the output node ON1 is pulled up to a power-supply voltage level. That is, when the first output circuit 133 is turned off by de-asserting the selection signal SEL0 to a low level, the output node ON1 outputting the first data signal DATA[0] may be pulled up to the power-supply voltage level so as to prevent the first data signal DATA[0] from being floated.

The second precharge circuit 136 may include the PMOS transistor P8. The second precharge circuit 136 may precharge the second data signal DATA[1] when the second output circuit 134 is turned off (that is, when the second output circuit 134 is not passing the value of the input signal IN to the second data signal DATA[1]), and may thus prevent reduction of a voltage level of the second data signal DATA[1].

The PMOS transistor P8 may be coupled between the power-supply voltage terminal and an output node ON2, and may receive the selection signal SEL1 through a gate terminal thereof. When the selection signal SEL1 is asserted to a high level, the PMOS transistor P8 is turned off. In contrast, when the selection signal SEL1 is de-asserted to a low level, the PMOS transistor P8 is turned on, such that the output node ON2 is pulled up to the power-supply voltage level. That is, when the second output circuit 134 is turned off by de-asserting the selection signal SEL1 to a low level, the output node ON2 outputting the second data signal DATA[1] is pulled up to the power-supply voltage level such that the second data signal DATA[1] is prevented from being floated.

The embodiment shown in FIG. 4 of the present disclosure includes two output circuits 133 and 134 and two precharge circuits 135 and 136 according to the number (e.g., 2) of PMOS transistors (here, P1[0] and P1[1]) in the first transistor array PA1. However, embodiments of the present disclosure are not limited thereto, and the number of output circuits 133 and 134 and the number of precharge circuits 135 and 136 may vary according to a number of input transistors. Although the embodiment shown in FIG. 4 of the present disclosure includes the output circuits 133 and 134 being respectively composed of the transfer gates T0 and T1 for convenience of description, the output circuits 133 and 134 may be composed of PMOS or NMOS transistors. Although the embodiment shown in FIG. 4 includes the precharge circuits 135 and 136 being respectively composed of the PMOS transistors P7 and P8, the precharge circuits 135 and 136 may also be composed of NMOS transistors.

Values of the selection signals SEL0 and SEL1 of the gain controller 131 including the above-mentioned constituent elements are shown in the following Table 1.

TABLE 1

|  | MD (low-power mode) | | MD (high-performance mode) | |
| --- | --- | --- | --- | --- |
| CON | SEL1 | SEL0 | SEL1 | SEL0 |
| SLOW MODE ("11") | 1 | 1 | 1 | 1 |
| TYPICAL MODE ("10") | 1 | 0 | 1 | 1 |
| FAST MODE ("01") | 0 | 1 | 1 | 1 |

The selection circuit 132 may output the selection signals SEL0 and SEL1 corresponding to the control signal CON in response to the mode signal MD. The mode signal MD applied to the selection circuit 132 may indicate one of a low-power mode and a high-performance mode.

When the mode signal MD indicates the low-power mode, the selection circuit 132 may change the values of the selection signals SEL0 and SEL1 in response to the control signal CON. In contrast, when the mode signal MD indicates the high-performance mode, the selection circuit 132 may maintain the values of the selection signals SEL0 and SEL1 at an asserted value (e.g., a logic high level "1") irrespective of the control signal CON.

When the mode signal MD indicates a high-performance mode, the selection circuit 132 may increase the operation speed of the amplification circuit 140 in FIG. 3 by activating all the transistors in the first transistor array PA1 of the amplification circuit 140, by asserting the selection signals SEL0 and SEL1. Therefore, all the output circuits 133 and 134 are turned on in the high-performance mode, such that all the PMOS transistors P1[1:0] in the first transistor array PA1 in FIG. 3 operate. Similarly, when the mod signal MD indicates the high-performance mode, a selection circuit (not shown) in each of the second and third gain controllers 137 and 138 asserts selection signals. As a result, all the transistors in the second and third transistor arrays PA2 and PA3 in FIG. 3 operate in the high-performance mode, thereby increasing the operation speed of the amplification circuit 140.

On the other hand, when the mode signal MD indicates a low-power mode, the selection circuit 132 may adjust the operation speed by activating only some of transistors included in the first transistor array PA1 of the amplification circuit 140. Specifically, in the low-power mode, one of the output circuits 133 and 134 may be activated according to a value of the control signal CON, such that the number of operating PMOS transistors P1[1:0] in the first transistor array PA1[1:0] may be adjusted.

For example, when the control signal CON of the control signal indicates a slow fabrication condition SLOW MODE in response to the sensing signal SEN of the fabrication sensor 110 in FIG. 3 (e.g., when the value of the control signal CON is set to "11"), each of the selection signals SEL0 and SEL1 has a high value. Thus, both of the output circuits 133 and 134 are turned on, such that all the PMOS transistors in the first transistor array PA1 are activated in response to the data signal DATA[1:0]. Accordingly, when both the first and second output circuits 133 and 134 are turned on a current $I_{PA1}$ passing through the first transistor array PA1 corresponds to a value $V_{IN}$ of the input signal IN times the sum of the transconductance $g_m(P1[0])$ of the PMOS transistor P1[0] and the transconductance $g_m(P1[1])$ of the PMOS transistor P1[1], e.g.: $I_{PA1}=V_{in}\times(g_m(P1[0])+g_m(P1[0]))$.

When the control signal CON indicates a typical fabrication condition TYPICAL MODE in response to the sensing signal SEN of the fabrication sensor 110 (e.g., when the control signal CON has a value of "10"), the selection signal SEL0 has a low value and the selection signal SEL1 has a high value. Only the second output circuit 134 from among the output circuits 133 and 134 is turned on, such that only the input transistor (PMOS transistor P1[1]) having higher driving capability is turned on by second data signal DATA [1]. The embodiment of the present disclosure may assume that only the PMOS transistor P1[1] from among two PMOS transistors of the first transistor array PA1 has higher driving capability (that is, a higher transconductance) for convenience of description and better understanding of the present disclosure. Accordingly, when the second output circuit 134 is turned on and the first output circuit 133 is turned off, the current $I_{PA1}$ passing through the first transistor array PA1 corresponds to the value $V_{IN}$ of the input signal IN times the transconductance $g_m(P1[1])$ of the PMOS transistor P1[1], e.g.: $I_{PA1}=V_{in}\times g_m(P1[1])$.

In addition, when the value of the control signal CON indicates a fast fabrication condition FAST MODE in response to the sensing signal SEN of the fabrication sensor 110 (e.g., when the value of the control signal CON is set to "01"), the selection signal SEL0 has a high value and the selection signal SEL1 has a low value. As a result, the first output circuit 133 is turned on, and the second output circuit 134 is turned off. Thus, the first one of the PMOS transistors (P1[0]) in the first transistor array PA1 operates in response to the first data signal DATA[0], and the second one of the PMOS transistors (P1[1]) is turned off. In the embodiment shown in FIGS. 3 and 4, the first one of the PMOS transistors in the first transistor array PA1 has lower driving capability (that is, a lower transconductance) than the second one of the PMOS transistors for convenience of description and better understanding of the present disclosure. Accordingly, when the first output circuit 133 is turned on and the second output circuit 134 is turned off, the current $I_{PA1}$ passing through the first transistor array PA1 corresponds to the value $V_{IN}$ of the input signal IN times the transconductance $g_m(P1[0])$ of the PMOS transistor P1[0], e.g.: $I_{PA1}=V_{in}\times g_m(P1[0])$.

When an amplification circuit (e.g., the amplification circuit 140 of FIG. 3) of a receiver circuit (e.g., the receiver circuit RX in FIG. 2) is designed, the amplification circuit may be designed on the basis of an operation speed used in the slow mode (SLOW MODE). The designed circuit may be over-designed during the typical mode (TYPICAL MODE) and the fast mode (FAST MODE), power consumption may also be increased. When transistors in the amplification circuit are typical transistors or fast transistors, rather than slow transistors, all of the transistors of the amplification circuit may not be required to perform a specific operation in the lower-power mode. In other words, some of the transistors of the amplification circuit may perform the specific operation in the lower-power mode. Therefore, according to embodiments of the present disclosure, the number of operating transistors may be adjusted according to a fabrication condition, and the operation speed of the amplification circuit is controlled, such that the amount of power consumption can be reduced when a sensing signal indicates the typical mode (TYPICAL MODE) or the fast mode (FAST MODE) and the receiver circuit operates in the low-power mode.

Other input transistors in the second transistor array PA2 and the tail transistors in the third transistor array PA3 may operate in the substantially same manner as described above, and thus detailed descriptions thereof will herein be omitted for convenience of description.

Figure 5:
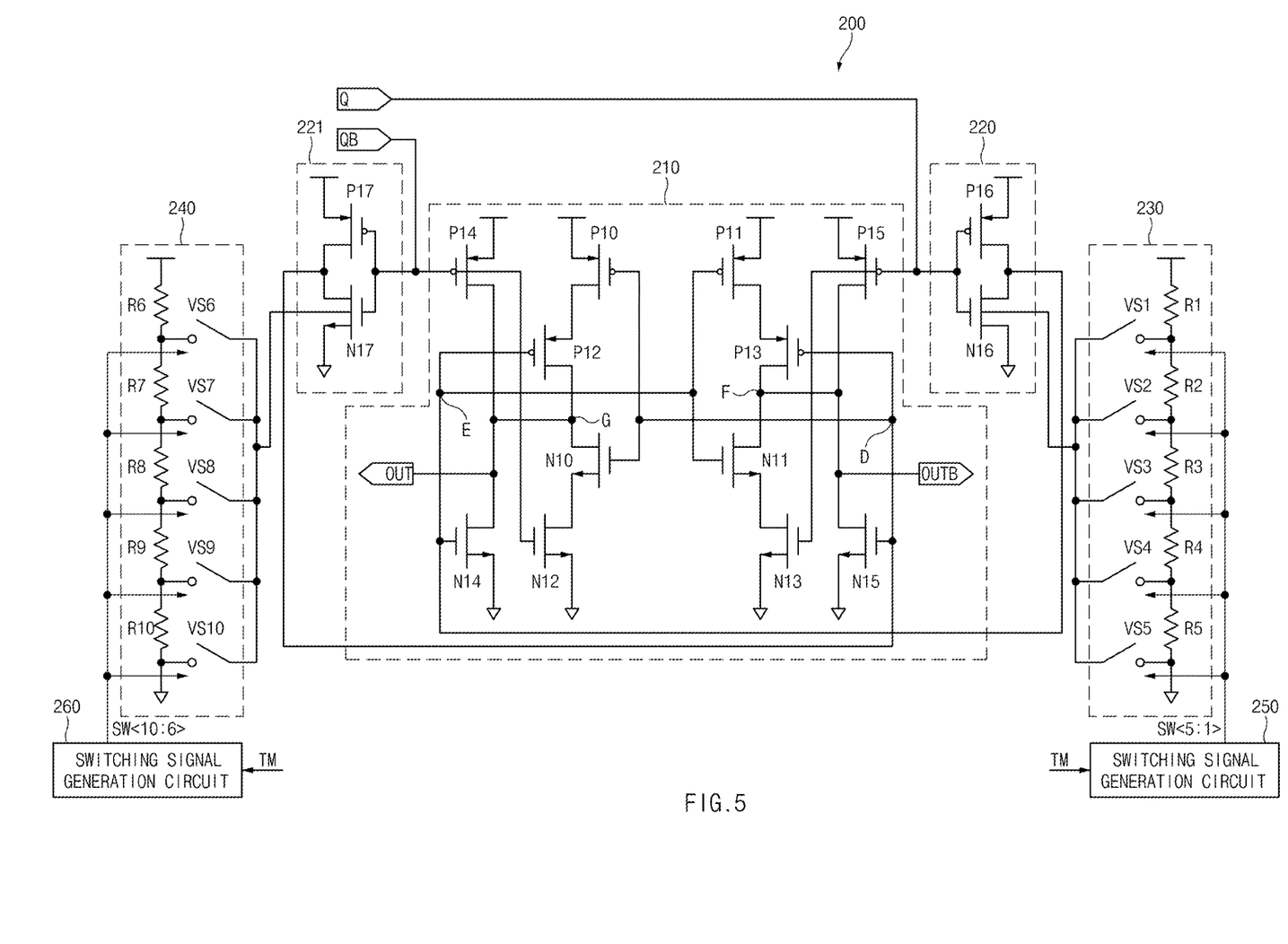
FIG. 5 illustrates a circuit diagram of a latch circuit suitable for use as a latch circuit in FIG. 2 according to an embodiment.

FIG. 5 is a circuit diagram illustrating the latch circuit 200 shown in FIG. 2 according to an embodiment.

Referring to FIG. 5, the latch circuit 200 may include a data latch 210, first and second inversion circuits 220 and 221, first and second ladder circuits 230 and 240, and first and second selection signal generation circuits 250 and 260.

In this case, the data latch 210 may latch data signals at input nodes D and E in response to latch signals Q and QB, and may generate output signals OUT and OUTB at output nodes F and G. The data latch 210 may include a plurality of PMOS transistors P10 to P15 and a plurality of NMOS transistors N10 to N15. Although the embodiment shown in FIG. 5 includes the data latch 210 that is composed of a NOR-type SR latch designed to perform a flip-flop function for convenience of description, a logic structure of the data latch 210 can be changed.

The PMOS transistors P10 and P12 and the NMOS transistors N10 and N12 may be coupled in series between a power-supply voltage terminal and ground. A gate terminal of the PMOS transistor P10 and a gate terminal of the NMOS transistor N10 may be commonly coupled to the input node D. The PMOS transistor P12 may be coupled to an input node E through a gate terminal thereof. The NMOS transistor N12 may receive the latch signal QB through a gate terminal thereof.

The PMOS transistors P11 and P13 and the NMOS transistors N11 and N13 may be coupled in series between the power-supply voltage terminal and the ground. A gate terminal of the PMOS transistor P11 and a gate terminal of the NMOS transistor N11 may be commonly coupled to the input node E. The PMOS transistor P13 may be coupled to the input node D through a gate terminal thereof. The NMOS transistor N13 may receive the latch signal Q through a gate terminal.

The PMOS transistor P14 and the NMOS transistor N14 may be coupled in series between the power-supply voltage terminal and the ground. The PMOS transistor P14 may receive the latch signal QB through a gate terminal thereof. The NMOS transistor N14 may be coupled to the input node E through a gate terminal thereof.

The PMOS transistor P15 and the NMOS transistor N15 may be coupled in series between the power-supply voltage terminal and the ground. The PMOS transistor P15 may receive the latch signal Q through a gate terminal thereof. The NMOS transistor N15 may be coupled to the input node D through a gate terminal thereof.

The first inversion circuit 220 may invert the latch signal Q, and may output the inverted latch signal to the input node E. The first inversion circuit 220 may include a PMOS transistor P16 and an NMOS transistor N16. The PMOS transistor P16 and the NMOS transistor N16 may be coupled in series between the power-supply voltage terminal and the ground. A gate terminal of the PMOS transistor P16 and a gate terminal of the NMOS transistor N16 may receive the latch signal Q, and a drain terminal of the PMOS transistor P16 and a drain terminal of the NMOS transistor N16 may be commonly coupled to the input node E.

The inversion circuit 221 may invert the latch signal QB, and may output the inverted latch signal QB to the input node D. The inversion circuit 221 may include a PMOS transistor P17 and an NMOS transistor N17. The PMOS transistor P17 and the NMOS transistor N17 may be coupled in series between the power-supply voltage terminal and the ground. A gate terminal of the PMOS transistor P17 and a gate terminal of the NMOS transistor N17 may receive the latch signal QB, and a drain terminal of the PMOS transistor P17 and a drain terminal of the NMOS transistor N17 may be commonly coupled to the input node D.

Operations of the data latch 210 having the above-mentioned constituent elements are described as follows.

When the latch signal Q has a high level and the latch signal QB has a low level, the PMOS transistor P14 is turned on, such that the output signal OUT has a high level. When the PMOS transistor P17 is turned on and a level of the input node D is pulled up to a high level, the NMOS transistor N15 is turned on, so that the output signal OUTB has a low level. In this case, the PMOS transistors P11 and P12 and the NMOS transistors N10 and N13 are turned on, so that a data latch status may be maintained during a predetermined time interval at the input node D.

When the latch signal Q has a low level and the latch signal QB has a high level, the PMOS transistor P15 is turned on, such that the output signal OUTB has a high level. When the PMOS transistor P16 is turned on and a level of the node E is pulled up to a high level, the NMOS transistor N14 is turned on, so that the output signal OUT has a low level. In this case, the PMOS transistors P10 and P13 and the NMOS transistors N11 and N12 are turned on, so that a data latch status may be maintained during a predetermined time interval at the input node E.

In response to activation or deactivation of the NMOS transistors N12 to N15, the data latch 210 may latch data using the PMOS transistors P10 and P11 and the NMOS transistors N10 and N11 which are cross-coupled to one another, during a predetermined time interval, such that the output nodes F and G outputs the latched data as the output signals OUTB and OUT, respectively.

Meanwhile, the first ladder circuit 230 may adjust a resistance value in response to a plurality of switching signals SW<5:1>, and may provide a voltage corresponding to the adjusted resistance value to the inversion circuit 220. The first ladder circuit 230 may include a plurality of resistors R1 to R5 and a plurality of switching circuits VS1 to VS5.

The plurality of resistors R1 to R5 may be coupled in series between the power-supply voltage terminal and the ground. Each of the plurality of switching circuits VS1 to VS5 may have a first end coupled to a bulk terminal of the NMOS transistor N16 and a second end coupled to a connection node between two neighboring ones of the resistors R1 to R5. The respective switching circuits VS1 to VS5 may be selectively turned on in response to the plurality of switching signals SW<5:1>.

The second ladder circuit 240 may adjust a resistance value in response to the plurality of switching signals SW<10:6>, and may provide a voltage corresponding to the adjusted resistance value to the second inversion circuit 221. The second ladder circuit 240 may include a plurality of resistors R6 to R10 and a plurality of switching circuits VS6 to VS10.

The plurality of resistors R6 to R10 may be coupled in series between the power-supply voltage terminal and the ground. Each of the plurality of switching circuits VS6 to VS10 may have a first end coupled to a bulk terminal of the NMOS transistor N17 and a second end coupled to a connection node between two neighboring ones of the resistors R6 to R10. The plurality of switching circuits VS6 to VS10 may be selectively turned on in response to the plurality of switching signals SW<10:6>.

Any one of the switching circuits VS1 to VS5 may be turned on according to the plurality of switching signals SW<5:1>, such that a bulk voltage of the NMOS transistor N16 is controlled. For example, when the switching circuit VS1 is turned on by a switching signal SW<1>, the bulk voltage of the NMOS transistor N16 may have a value corresponding to the resistance value of the resistor R1. Specifically, the bulk voltage of the NMOS transistor N16 has a level proportional to (RV2+RV3+RV4+RV5)/(RV1+RV2+RV3+RV4+RV5), RVi indicating a resistance value of an ith resistor Ri (i=1, 2, 3, 4, or 5). When the switching circuit VS5 is turned on by a switching signal SW<5>, the bulk voltage of the NMOS transistor N16 may be set to a ground voltage level corresponding to a default value. Operations of the second ladder circuit 240 are substantially identical to those of the first ladder circuit 230, and detailed descriptions thereof will herein be omitted for convenience of description.

In an embodiment, the bulk voltage of the NMOS transistor N16 is set to the lowest level when the switching signal SW<5> is asserted, and the bulk voltage is set to the highest level when the switching signal SW[1] is asserted. Likewise, the bulk voltage the NMOS transistor N17 is set to the lowest voltage when the switching signal SW<10> is asserted, and the bulk voltage is set to the highest voltage when the switching signal SW<6> is asserted.

The first switching signal generation circuit 250 may generate the plurality of switching signals SW<5:1> for controlling the first ladder circuit 230 in response to the test signal TM. The second switching signal generation circuit 260 may generate the plurality of switching signals SW<10:6> for controlling the second ladder circuit 240 in response to the test signal TM. The switching signal generation circuits 250 and 260 may generate the switching signals SW<5:1> and the SW<10:6>. For example, a bit value of the switching signals SW<5:1> and the SW<10:6> may sequentially change by a 5-bit control code signal during a training mode of a semiconductor device (e.g., the first semiconductor device 10 or the second semiconductor device 20 in FIG. 1).

The latch circuit 200 may increase threshold voltages of NMOS transistors N16 and N17 included in the inversion circuits 220 and 221, respectively, and may thus rapidly drive voltage levels of the latch signals Q and QB. In other words, in accordance with the embodiment shown in FIG. 5, the bulk voltages of the NMOS transistors N16 and N17 functioning as pull-down drive elements of the inversion circuits 220 and 221 are controlled by the ladder circuits 230 and 240, respectively. As a result, voltage levels of the latch signals Q and QB can be rapidly pulled down. When the bulk voltage levels of the NMOS transistors N16 and N17 are adjusted, the inversion circuits 220 and 221 are rapidly pulled down, resulting in reduction of the operation delay time of the latch circuit 200.

As is apparent from the above description, a receiver circuit (e.g., the receiver circuit RX in FIG. 2) according to an embodiment of the present disclosure may adaptively and actively control a gain of a circuit (e.g., the amplification circuit 140 in FIG. 3) of the receiver circuit according to change of a fabrication process of a semiconductor device, resulting in reduction of power consumption.

Those skilled in the art will appreciate that the embodiments may be carried out in other specific ways than those set forth herein without departing from the spirit and essential characteristics of the disclosure. The above embodiments are therefore to be construed in all aspects as illustrative and not restrictive. The scope of the disclosure should be determined by the appended claims and their legal equivalents, not by the above description. Further, all changes coming within the meaning and equivalency range of the appended claims are intended to be embraced therein.

Although a number of illustrative embodiments have been described, it should be understood that numerous other modifications and embodiments are possible. Particularly, numerous variations and modifications are possible in the component parts and/or arrangements which are within the scope of the disclosure, the drawings and the accompanying claims.

What is claimed is:

1. A receiver circuit comprising:
   an input buffer including a first plurality of transistors, the input buffer being configured to detect a fabrication condition of the receiver circuit by a fabrication sensor, generate a control signal according to the detected fabrication condition, and control a gain of an input signal by adjusting a number of operating transistors among the first plurality of transistors in response to the control signal; and
   a latch circuit configured to latch an output signal of the input buffer and adjust threshold voltages of a second plurality of transistors in response to a test signal.

2. The receiver circuit according to claim 1, wherein the input buffer includes:
   the fabrication sensor configured to output a sensing signal by detecting the fabrication condition;
   an analog-to-digital converter (ADC) configured to generate the control signal by converting the sensing signal into the control signal;
   a controller configured to generate a gain controlled signal in response to a mode signal and the control signal; and
   an amplification circuit configured to amplify the input signal according to the gain by changing the number of the operating transistors according to the gain controlled signal of the controller.

3. The receiver circuit according to claim 2, wherein the fabrication sensor stops sensing after being operated only once.

4. The receiver circuit according to claim 2, wherein the controller is a first gain controller, the receiver circuit further comprising a second gain controller.

5. The receiver circuit according to claim 4, wherein each of the first and second gain controllers includes:
   a selection circuit configured to output first and second selection signals in response to the control signal and the mode signal; and
   an output circuit configured to transmit or block the input signal in response to the first selection signal or the second selection signal.

6. The receiver circuit according to claim 5, wherein each of the first and second gain controllers further includes:
a precharge circuit configured to precharge an output terminal in response to the first selection signal or the second selection signal.

7. The receiver circuit according to claim 5, wherein:
when the mode signal indicates a first mode, the selection circuit changes one or both of a logic value of the first selection signal and a logic value of the second selection signals in response to the control signal; and
when the mode signal indicates a second mode, the selection circuit maintains the logic values of the first and second selection signals at a specific value.

8. The receiver circuit according to claim 5, wherein:
when the control signal indicates a slow fabrication condition, the selection circuit generates the first and second selection signals both having a logic high value;
when the control signal indicates a typical fabrication condition, the selection circuit generates the first selection signal having a logic low value and generates the second selection signal having a logic high value; and
when the control signal indicates a fast fabrication condition, the selection circuit generates the first selection signal having the logic high value and generates the second selection signal having the logic low value.

9. The receiver circuit according to claim 2, wherein the controller is one of a first gain controller, a second gain controller, and a third gain controller,
wherein the first gain controller is configured to output a plurality of data signals as the gain controlled signal in response to the mode signal, the input signal, and the control signal,
wherein the second gain controller is configured to output a plurality of gate control signals as the gain controlled signal, in response to the mode signal, a clock signal, and the control signal, and
wherein the third gain controller is configured to output a plurality of reference signals as the gain controlled signal in response to the mode signal, an inverted version of the input signal, and the control signal.

10. The receiver circuit according to claim 2, wherein the gain controlled signal is one of a data signal, a gate control signal, and a reference signal,
wherein the amplification circuit includes:
a first transistor array including a plurality of tail transistors, each of the plurality of tail transistors being configured to pull up a first node by a corresponding signal of the gate controlled signal, a number of operating tail transistors varying in response to the gate control signal; and
a second transistor array including a plurality of input transistors, each of the plurality of input transistors being coupled to the first node, a number of operating input transistors varying in response to the data signal or the reference signal.

11. The receiver circuit according to claim 10, wherein the plurality of tail transistors have different driving capabilities, and the plurality of input transistors have different driving capabilities.

12. The receiver circuit according to claim 2, wherein, when the mode signal indicates a first mode, the number of the operating transistors is the same as a number of the first plurality of transistors of the input buffer.

13. The receiver circuit according to claim 2, wherein, when the mode signal indicates a second mode, the number of the operating transistors is less than a number of the first plurality of transistors of the input buffer.

14. The receiver circuit according to claim 2, wherein the mode signal indicates one of a high-performance mode and a low-power mode.

15. The receiver circuit according to claim 1, wherein the latch circuit includes:
a data latch configured to latch the output signal of the input buffer;
an inversion circuit configured to invert the output signal of the input buffer;
a ladder circuit configured to adjust a resistance value in response to a plurality of switching signals, and provide a signal corresponding to the adjusted resistance value to the inversion circuit; and
a switching signal generation circuit configured to generate the plurality of switching signals in response to the test signal.

16. The receiver circuit according to claim 15, wherein the data latch is an SR latch.

17. The receiver circuit according to claim 15, wherein the inversion circuit includes a transistor, a bulk voltage of the transistor being controlled in response to the signal corresponding to the adjusted resistance value of the ladder circuit.

18. The receiver circuit according to claim 15, wherein the ladder circuit controls a threshold voltage of a pull-down transistor of the inversion circuit in response to the plurality of switching signals.

19. The receiver circuit according to claim 15, wherein the ladder circuit includes:
a plurality of resistors coupled in series between a power-supply voltage terminal and a ground; and
a plurality of switching circuits each having a first end coupled to a bulk terminal of a transistor in the inversion circuit and having a second end coupled to a connection node between two neighboring ones of the plurality of resistors, each of the switching circuits being turned on in response to a corresponding one of the plurality of switching signals.

20. The receiver circuit according to claim 15, wherein the switching signal generation circuit generates the plurality of switching signals during a training mode of a semiconductor device, the semiconductor device including the receiver circuit.

* * * * *